(12) United States Patent
Hung et al.

(10) Patent No.: US 8,921,013 B2
(45) Date of Patent: Dec. 30, 2014

(54) SYSTEM AND METHOD FOR TEST PATTERN FOR LITHOGRAPHY PROCESS

(71) Applicant: Semiconductor Manufacturing International (Shanghai) Corporation, Shanghai (CN)

(72) Inventors: Chi-Yuan Hung, Li-Lan (CN); Bin Zhang, Shanghai (CN); Ze Xi Deng, Shanghai (CN); Li Guo Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/940,260

(22) Filed: Jul. 12, 2013

(65) Prior Publication Data

US 2013/0302725 A1 Nov. 14, 2013

Related U.S. Application Data

(62) Division of application No. 13/046,733, filed on Mar. 12, 2011, now Pat. No. 8,501,376.

(30) Foreign Application Priority Data

Mar. 12, 2010 (CN) .......................... 2010 1 0123603

(51) Int. Cl.
*G03F 1/44* (2012.01)
(52) U.S. Cl.
CPC ....................................... *G03F 1/44* (2013.01)
USPC .................... 430/4; 430/30; 257/48; 257/797
(58) Field of Classification Search
CPC ....................................................... G03F 1/44
USPC ..................................... 430/5, 30; 257/48, 797
See application file for complete search history.

(56) References Cited

U.S. PATENT DOCUMENTS

| | | | | |
|---|---|---|---|---|
| 6,681,379 | B2 * | 1/2004 | Pierrat et al. | ....................... 430/5 |
| 6,777,145 | B2 * | 8/2004 | Zhou et al. | ....................... 430/30 |
| 7,079,235 | B2 | 7/2006 | Lehman | |
| 7,427,457 | B1 * | 9/2008 | Plat et al. | ....................... 430/5 |
| 7,691,544 | B2 | 4/2010 | Gardiner et al. | |
| 7,735,053 | B2 | 6/2010 | Harazaki | |
| 7,855,037 | B2 * | 12/2010 | Kim | ................................. 430/5 |
| 7,879,537 | B1 * | 2/2011 | Rigby et al. | .................. 430/394 |
| 8,501,376 | B2 | 8/2013 | Hung et al. | |
| 2011/0057333 | A1 | 3/2011 | Di Giacomo et al. | |

FOREIGN PATENT DOCUMENTS

CN 1116731 A 2/1996

OTHER PUBLICATIONS

Restriction Requirement for U.S. Appl. No. 13/046,733 mailed Oct. 24, 2012, 7 pages.
Non-Final Office Action for U.S. Appl. No. 13/046,733 mailed Dec. 11, 2012, 5 pages.
Notice of Allowance for U.S. Appl. No. 13/046,733 mailed Apr. 11, 2013, 6 pages.

* cited by examiner

*Primary Examiner* — Christopher Young
(74) *Attorney, Agent, or Firm* — Kilpatrick Townsend and Stockton LLP

(57) ABSTRACT

A lithographic mask reticle includes a first mask region having a first mask pattern configured for use in fabrication of electronic circuit structures, and a second mask region having a second mask pattern configured for use in fabrication of test structures. The second mask pattern includes all categories of structural patterns containing in the first mask pattern.

20 Claims, 5 Drawing Sheets

SYSTEM AND METHOD FOR TEST PATTERN FOR LITHOGRAPHY PROCESS

CROSS-REFERENCES TO RELATED APPLICATIONS

This application is a divisional of U.S. patent application Ser. No. 13/046,733, filed Mar. 12, 2011, which claims priority to Chinese Patent Application No. 201010123603.2, filed Mar. 12, 2010, which is commonly assigned and incorporated by reference herein for all purposes.

BACKGROUND OF THE INVENTION

Embodiments of the present invention are generally related to photolithography for the manufacture of semiconductor devices. More particularly, embodiments of the present invention provide combination test patterns used for photolithography process tuning and monitoring.

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers.

An integral component of photolithographic apparatus is a "reticle" which includes a pattern corresponding to features at one layer in an IC design. The reticle typically includes a transparent glass plate covered with a patterned light blocking material such as chromium. The reticle is placed between a radiation source producing radiation of a pre-selected wavelength and a focusing lens, which may form part of a "stepper" apparatus. Placed beneath the stepper is a resist covered silicon wafer. When the radiation from the radiation source is directed onto the reticle, light passes through the glass (regions not having chromium patterns) projects onto the resist covered silicon wafer to produce photo-generated acid. The resist is typically baked to undergo chemical changes that alter its dissolution properties. Subsequent development process is needed to obtain the relief image on wafer. In this manner, an image of the reticle is transferred to the resist.

As light passes through the reticle, it is refracted and scattered by the chromium edges. This causes the projected image to exhibit some rounding and other optical distortion. Furthermore, resist processing effects during the bake process, such as nonlinear diffusion of the photo-generated acid, exacerbate the pattern distortion on the wafer. Subsequent pattern transfer processing effects, such as etch bias, further degrade the pattern fidelity. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process. Recent semiconductor devices have scaled down to 60 nm.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to a reticle glass.

Conventional lithography processes including OPC techniques suffer from many drawbacks, some of which are described below. Therefore, there is a need for improve techniques that can improve OPC effectiveness and photolithography process tuning and monitoring.

BRIEF SUMMARY OF THE INVENTION

Embodiments of the present invention relate to test patterns for lithography process that is used for process tuning and monitoring. The test patterns can be used to optimize a lithography process to adjust for the mask quality. The test patterns enable detection of problematic points on the wafer easily. The embodiments may also be used for optical proximity correction.

In one embodiment, a method for performing a photolithography process includes providing a reticle on a projection apparatus, the reticle having a test pattern defined thereon, the test pattern including a plurality of one-dimensional structures and a plurality of two-dimensional structures. The test pattern defined on the reticle is transferred to at least one area on a wafer. The projection apparatus is focused on the test pattern transferred on the wafer during a photolithography process to perform a process monitoring. In a specific embodiment, the projection apparatus is a stepper.

The test pattern in the above method has a plurality of structures selected from the group consisting of: Full dense line, Isolated line, Semi-dense line (forbidden pitch), Semi-dense trench (forbidden pitch), Isolated trench, Bigmag structure, Isolated Head-to-head, T-shape dense, Nested iso H-H, Dense H-H, Symmetric dense T-shape, Iso T-shape, Iso trench H-H, Symmetric comb, Dense comb, Semi-dense comb, Semi-trench comb, Iso line-end shortening, 45° D/R, Iso pipe, Dense pipe, 135° corner, 45° corner, 45° trench, 90° iso corner, 90° iso trench, 90° dense corner, Iso Hole, Iso island, Sandglass shape, Iso intrusion, Concave, Double scattering Bar, Single scattering Bar, Perpendicular iso H-H, Perpendicular dense H-H, 2-to-1 trench, D&C Swerve, T to big block, Solid circle, Hollow circle, T to big 45° block, Trench Funnel, Gradient Line, and Gradient trench.

In an embodiment of the method described above, a minimum geometry in the test pattern is 90 nm, and the test pattern is no more than 16×16 μm. In another embodiment, a minimum geometry in the test pattern is 45 nm and the test pattern is no more than 8×8 μm. In yet another embodiment, a minimum geometry in the test pattern is 30 nm and the test pattern is no more than 6×6 μm. In an embodiment, each of the one-dimension structures and the two dimension structures includes a dense region, an isolated region, and a linear region. In another embodiment, the test pattern is provided on each of corners of the reticle, the test pattern being used for monitoring optical performance, process window, and/or process evaluation. In another embodiment, the test pattern has at least 10 structures discussed above. In another embodiment, the test pattern has at least 20 structures discussed above. In yet another embodiment, the test pattern has at least 30 structures discussed above.

In another embodiment, a method for performing a photolithography process includes providing a reticle on a projection apparatus. The reticle has a test pattern including a plurality of test structures. In an embodiment, the test pattern includes:

1. first and second dense regions, each of the dense regions having three or more test structures in a two-dimensional arrangement;
2. a linear region between the first and second dense regions, the linear region having two or more test structures in a linear arrangement; and
3. one or more isolated regions, each of the isolated regions having one or two test structures, each of the isolated regions being spaced apart from the dense regions and the linear region.

In yet another embodiment, a lithographic mask reticle can have a first mask region and a second mask region. The first mask region includes a first mask pattern configured for use in fabricating electronic circuit structures, and the second mask region includes a second mask pattern configured for use in fabricating test structures. In an embodiment, the second mask pattern includes all categories of structural patterns in the first mask pattern. In some embodiments of the lithographic mask reticle, the second mask pattern includes only one structure from each of the categories of structural patterns in the first mask pattern.

Embodiments of the present invention can provide many benefits over conventional techniques. For example, embodiments of the present invention provide easy to use processes that rely upon conventional technology. In some embodiments, the methods use comprehensive test patterns that include many important features and have relatively small size. These test patterns can be disposed in multiple locations on a reticle and can be used for monitoring process window and identifying potential weaknesses in the process. Additionally, the methods provide processes that are compatible with conventional process technology without substantial modifications to conventional equipment and processes.

Depending upon the embodiment, one or more of these benefits may be achieved. These and other benefits will be described in more detail throughout the present specification and more particularly below. Various additional embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Embodiments of the present invention are generally related to photolithography for the manufacture of semiconductor devices. More particularly, embodiments of the present invention provide combination test patterns used for photolithography process tuning and monitoring. Various modifications to the preferred embodiments and the generic principles and features described herein will be readily apparent to those skilled in the art. Thus, embodiments of the present invention are not intended to be limited to the embodiments shown, but is to be accorded the widest scope consistent with the principles and features described herein.

Figure 1:
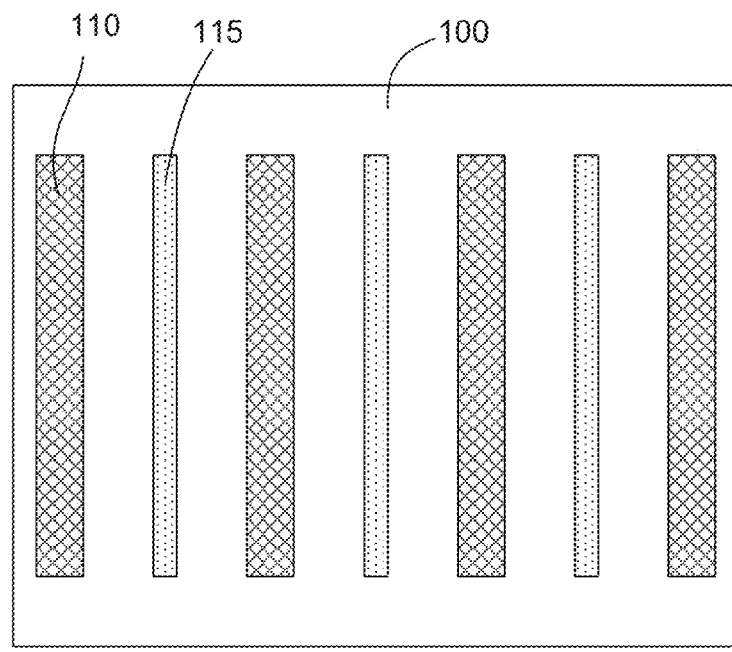
FIG. 1 illustrates a conventional test pattern for optical proximity correction (OPC)

FIG. 1 illustrates a conventional test pattern 100 for optical proximity correction (OPC). FIG. 1 shows that test pattern 100 includes stripe patterns 110 and narrower auxiliary stripes 115 inserted in between for reducing optical proximity effects. As shown, conventional OPC test patterns can be simplistic and ineffective. As described below, embodiments of the present invention provide test patterns that can be used to improve the OPC process.

In addition to OPC, there is a need to perform lithography process tuning and monitoring. The lithography process tuning involves obtaining process windows for specific lithography processes that will be performed on the wafer. A test pattern may be used for such a purpose. The lithograph process monitoring involves checking whether or not the lithography is continuing to be performed satisfactorily during the lithography process. The lithography process tuning and monitoring, accordingly, should be performed to obtain optimal results. A test pattern is generally not used for both process tuning and the process monitoring. For example, photolithography process parameters such as "numerical aperture" and "sigma" are set based on whether the structure to be defined is a fully dense structure or a fully isolated (or iso) structure. Unfortunately, with such limited test structures, tuning of the photolithography process is not fully optimized and may result in defective patterns on a wafer.

In addition, it is generally not easy to monitor a photolithography process while the process is in progress. A reticle has many structures that are transferred to different parts of the wafer. Checking different patterns (or structures) provided at different locations of the wafer can be time consuming, particularly during the lithography process. In other instances, the process parameters are tuned based on a single pattern that includes only dense structures and isolated structures.

In various embodiments, the present invention recognizes that the process monitoring is important and should be performed to ensure optimal results. Process monitoring is further complicated by mask quality. For example, absence of a good quality mask, it is difficult to obtain the intended patterns (and/or structures) at the desired locations regardless of process tuning This becomes even more of an issue as the devices become smaller. Some semiconductor companies are fabricating 60 nm devices. The devices will become even smaller in the future. Therefore, a lithography test pattern that can monitor and optimized various patterns and structures is desirable.

Figure 2:
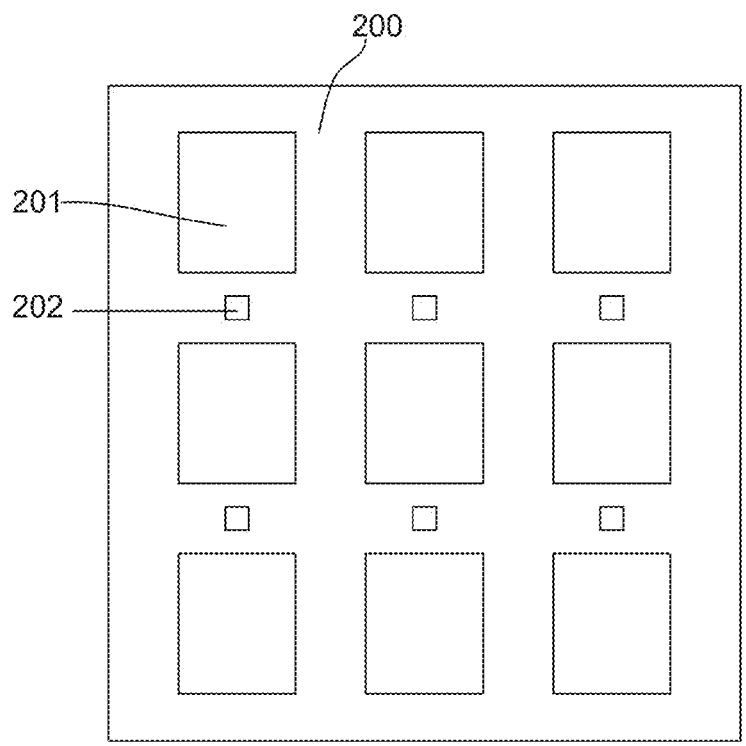
FIG. 2 illustrates a mask pattern arrangement on a mask reticle according to an embodiment of the present invention.

FIG. 2 illustrates a photolithographic mask reticle 200 according to an embodiment of the present invention. As shown, mask reticle 200 includes a first mask region 201, which has a first mask pattern configured for use in fabricating electronic circuit structures. Depending on the embodiments, the first mask region can include mask patterns for fabricating analog circuit, digital circuits, memory device and circuits, processor circuits, or other semiconductor circuits in various applications. Mask reticle 200 also includes a second mask region 202, which has a second mask pattern configured for use in fabricating test structures. Depending on the embodiment, the second mask pattern may include pattern structures for lithographic process tuning and monitoring, including for OPC.

Mask patterns for semiconductor circuits often include combinations of different numbers of multiple categories of structural patterns. These categories may include size, density, proximity properties, number of patterns, relative locations, etc. In some embodiments, the second mask pattern includes all categories structural patterns in the first mask pattern. For example, if mask region 201 includes multiple patterns from 10 categories of structural patterns arranged in a specific relationship, then mask region 202 include representative structures of each of those 10 categories. In some embodiments, mask region 202 can include additional structural patterns. In some embodiments, in order to reduce the die size, mask region 202 includes only one structure for each of the categories of structures.

Figure 3:
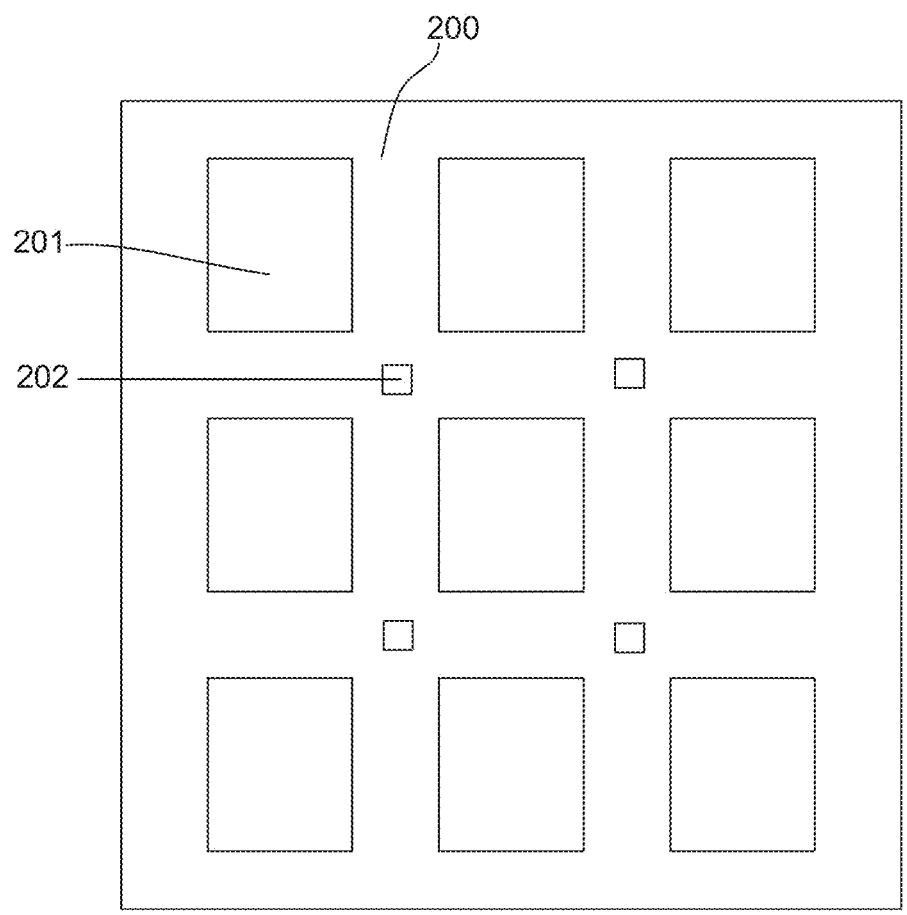
FIG. 3 illustrates a mask pattern arrangement on a mask reticle according to another embodiment of the present invention.

In some embodiments, the lithographic mask reticle includes a plurality of the first mask patterns and a plurality of the second mask patterns, as shown in FIG. 2. In some embodiments, the lithographic mask reticle contains only one first mask pattern and only one second mask pattern. In either case, the semiconductor wafer can have multiple first test patterns and multiple second test patterns. Various arrangements can be made to place the first test patterns and the second test patterns. FIG. 2 illustrates a mask pattern arrangement according to an embodiment of the present invention, in which each of the second mask patterns 202 is disposed between two adjacent first mask patterns 201. FIG. 3 illustrates a mask pattern arrangement according to another embodiment of the present invention, in which each of the second mask patterns 202 is disposed diagonally between four adjacent first mask patterns 201.

According to some embodiments, the packing density of the first mask patterns (the circuit or device patterns) and the second mask patterns (the test patterns) can be improved if the dimension of the second mask patterns (the test patterns) is selected based on the geometry of structures in the first mask patterns. In an example, the electronic circuit structures are characterized by a minimum geometry of 90 nm, and the second mask region is characterized by an area equal to or smaller than 16 um by 16 um. In another example, the electronic circuit structures are characterized by a minimum geometry of 45 nm, and the second mask region is characterized by an area equal to or smaller than 8 um by 8 um. In still another example, the electronic circuit structures are characterized by a minimum geometry of 30 nm, and the second mask region is characterized by an area equal to or smaller than 4 um by 4 um.

In some embodiments, second mask patterns (the test patterns) can include various specific structures. In a specific embodiment, the second mask region includes at least 30 structures selected from the group consisting of: Full dense line, Isolated line, Semi-dense line (forbidden pitch), Semi-dense trench (forbidden pitch), Isolated trench, Bigmag structure, Isolated Head-to-head, T-shape dense, Nested iso H-H, Dense H-H, Symmetric dense T-shape, Iso T-shape, Iso trench H-H, Symmetric comb, Dense comb, Semi-dense comb, Semi-trench comb, Iso line-end shortening, 45° D/R, Iso pipe, Dense pipe, 135° corner, 45° corner, 45° trench, 90° iso corner, 90° iso trench, 90° dense corner, Iso Hole, Iso island, Sandglass shape, Iso intrusion, Concave, Double scattering Bar, Single scattering Bar, Perpendicular iso H-H, Perpendicular dense H-H, 2-to-1 trench, D&C Swerve, T to big block, Solid circle, Hollow circle, T to big 45° block, Trench Funnel, Gradient Line, and Gradient trench. In other embodiments, the second mask region includes at least 10 or 20 of the above-mentioned structures.

Figure 4:
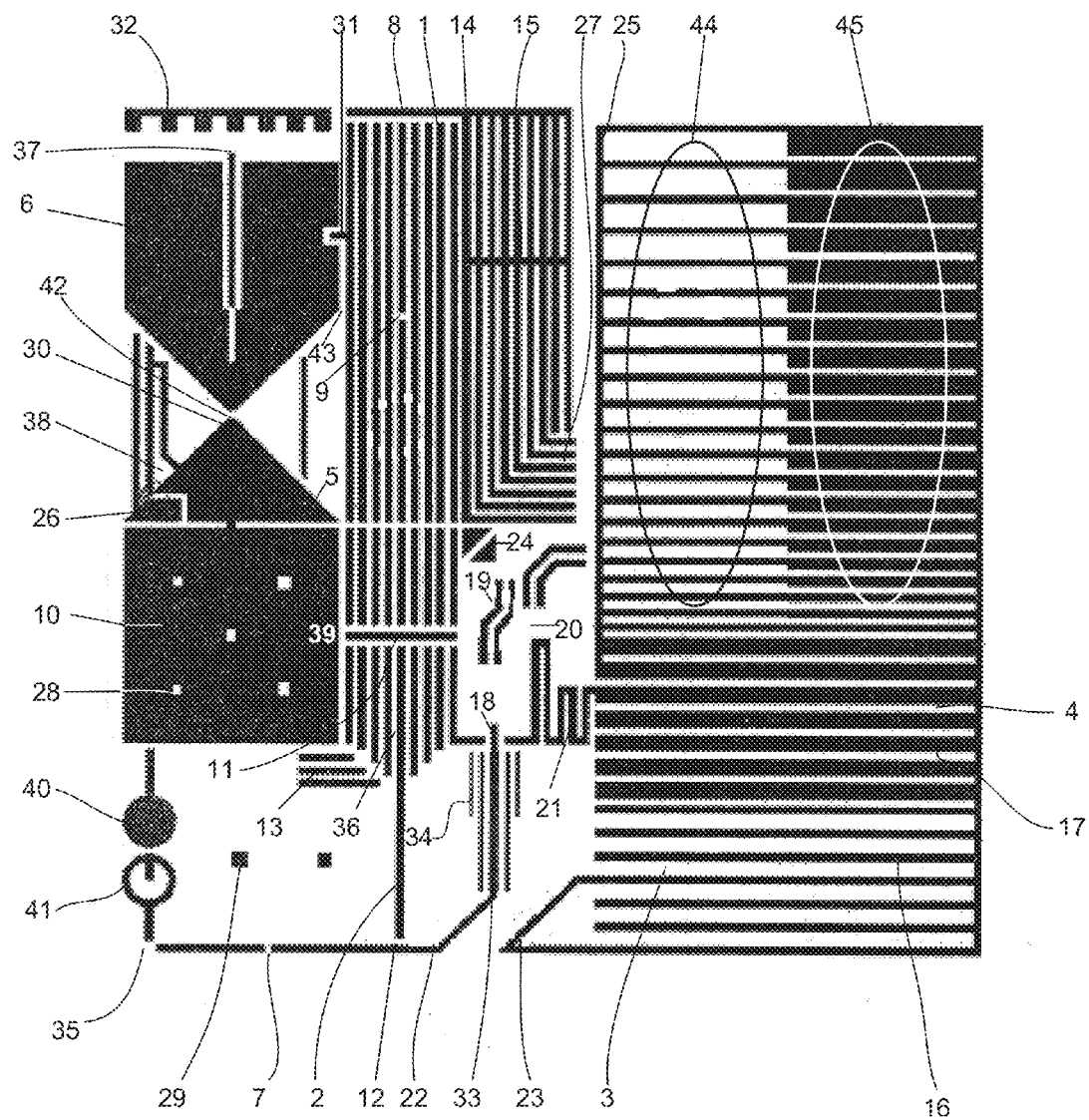
FIG. 4 illustrates a combination test pattern that can be used for a photolithography process tuning and monitoring according to one embodiment of the present invention.

FIG. 4 illustrates a combination test pattern 100 that can be used for a photolithography process tuning and monitoring according to one embodiment of the present invention. This diagram is merely an example, which should not unduly limit the scope of the claims. One of ordinary skill in the art would recognize many variations, alternatives, and modifications. The test pattern 100 has a plurality of structures defined within a small area, e.g., 16×16 μm, 8×8 μm, or 4×4 μm, etc. As shown, the test pattern has a plurality of one-dimensional structures and a plurality of two-dimensional structures.

In the present embodiment, the pattern 100 includes a plurality of the structures to cover all of the design structures in L/S layer. For example, test pattern 100 has forty-five structures. The structures and the number of the structures provided in the test pattern 100 may vary according to application. With such a comprehensive array of structures, test pattern 100 may be used for both the tuning and the monitoring.

For the purpose of illustration, the forty-five structures are numbered as indicated in FIG. 4 and listed below. These structures include:

| | |
|---|---|
| (1) Full dense line. | (2) Isolated line. |
| (3) Semi-dense line (forbidden pitch) | (4) Semi-dense trench (forbidden pitch) |
| (5) Isolated trench | (6) Bigmag structure |
| (7) Isolated Head-to-head | (8) T-shape dense |
| (9) Nested iso H-H | (10) Dense H-H |
| (11) Symmetric dense T-shape | (12) Iso T-shape |
| (13) Iso trench H-H | (14) Symmetric comb |
| (15) Dense comb | (16) Semi-dense comb |
| (17) Semi-trench comb | (18) Iso line-end shortening |
| (19) 45° D/R | (20) Iso pipe |
| (21) Dense pipe | (22) 135° corner |
| (23) 45° corner | (24) 45° trench |
| (25) 90° iso corner | (26) 90° iso trench |
| (27) 90° dense corner | (28) Iso Hole |
| (29) Iso island | (30) Sandglass shape |
| (31) Iso intrusion | (32) Concave. |
| (33) Double scattering Bar | (34) Single scattering Bar |
| (35) Perpendicular iso H-H | (36) Perpendicular dense H-H |
| (37) 2-to-1 trench | (38) D&C Swerve |
| (39) T to big block | (40) Solid circle |
| (41) Hollow circle | (42) T to big 45° block |
| (43) Trench Funnel | (44) Gradient Line |
| (45) Gradient trench | |

The test pattern 100 can be transferred or defined on any area on a wafer since the structures on the test pattern 100 are clustered in a small area, e.g., 16×16 μm. In other implementations, the size may be 10×10 μm or less. In a specific embodiment, the test pattern is defined on an area of a wafer, where the wafer is used to make integrated circuits.

In one embodiment, test pattern 100 is transferred onto edge regions of a wafer. Depending on the applications, test pattern 100 can be used in many ways. For example, the test pattern 100, accordingly, can be used to control and correct for lens aberration. When tuning and monitoring process, the photolithography team can focus on one of these corners whereon the test pattern 100 has been transferred to check process windows and determine whether there is any defective points on the wafer. In a specific embodiment, test pattern 100 may also be used to verify OPC recipes.

In a convention method, a contact hole ("CT") test pattern may have a dense 7×7 contact hole patterns and a 7×1 contact hole patterns. These conventional test structures often do not provide enough information for lithography process monitoring.

Figure 5:
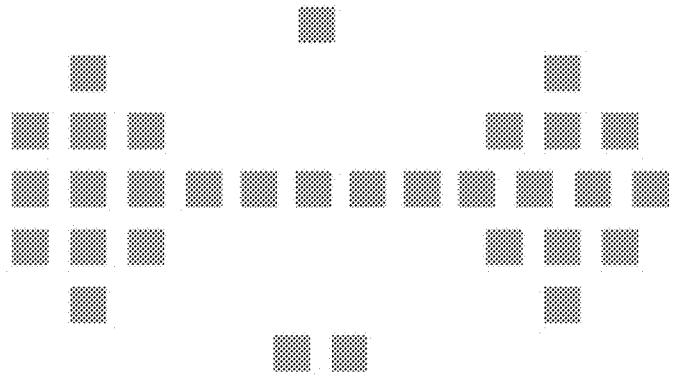
FIG. 5 illustrates a contact hole test pattern that can be used for both the process tuning and monitoring according to one embodiment of the present invention.
Figure 7:
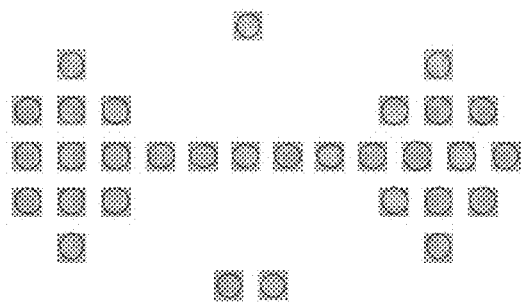
FIG. 7 illustrates the contact hole test structures of FIG. 5 transferred on a wafer for a process evaluation.

FIG. 5 illustrates a CT test pattern 300 that can be used for both lithography process tuning and monitoring according to one embodiment of the present invention. This diagram is merely an example, which should not unduly limit the scope of the claims. One of ordinary skill in the art would recognize many variations, alternatives, and modifications. As shown, test pattern 300 has dense structures 302, an iso structure 304, and a linear structure 306. In an embodiment, the process is evaluated after transferring the patterns to a wafer as shown in FIG. 7. The structures transferred to the wafer show a large critical dimension vs. pitch bias and strong asymmetry for the linear row of contacts (e.g., whether the circles are perfectly round). Test pattern 300 is less than 10×10 μm in the present implementation. Accordingly, it may be transferred to any place on the wafer, as described above. This enables a fast and easy process tuning and monitoring.

Figure 8:
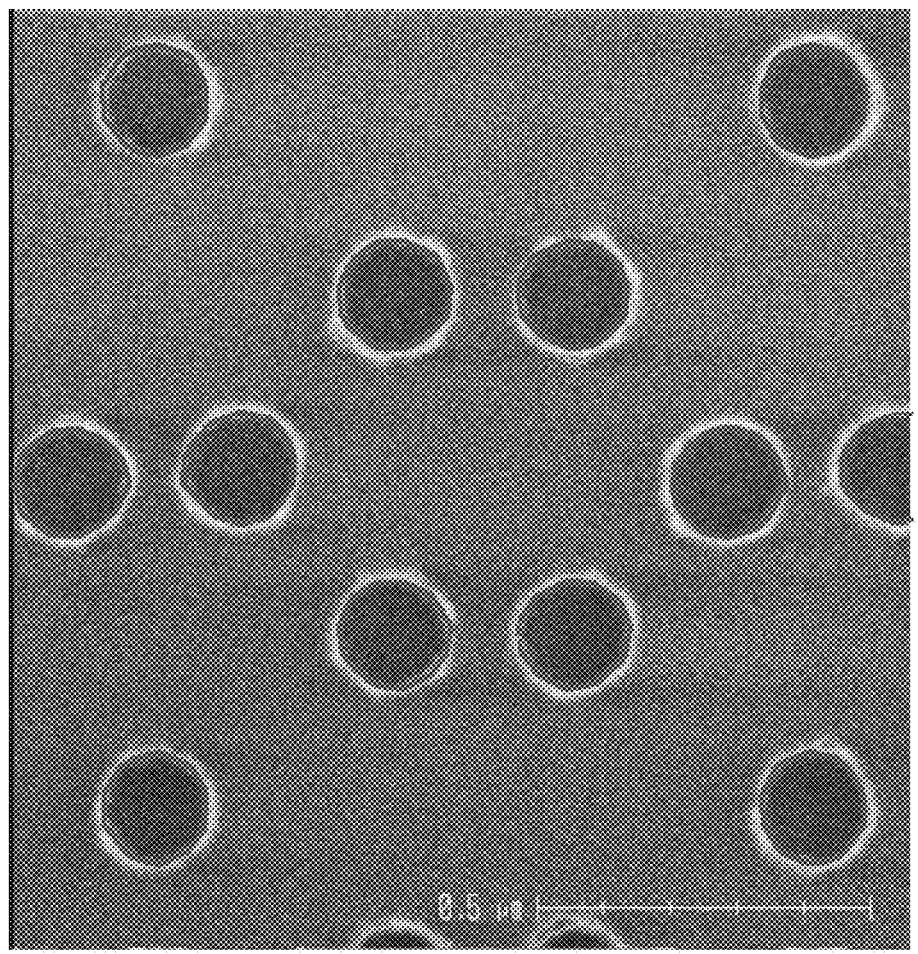
FIG. 8 illustrates an SEM image of test structures transferred on a wafer. The test pattern may be used for OPC validation and calibration using simulation overlay with the image.

Referring to FIG. 8, an SEM image 400 of CT structures transferred on the wafer is illustrated. This diagram is merely an example, which should not unduly limit the scope of the claims. One of ordinary skill in the art would recognize many variations, alternatives, and modifications. In a specific embodiment, test pattern 300 may be used for OPC validation and calibration using simulation overlay with SEM image 400. Since MBOPC aerial image simulation is reasonably accurate, it is possible to accurately compensate for a pitch bias asymmetry in a preferred embodiment. In a specific embodiment, the CT test structure may be provided on any desired location on the mask. In certain embodiments, the test structure may be provided on four corners of a mask allowing lens aberration to be monitored during the lithography process. In other embodiments, the test pattern can be used to check process window and to evaluate, for example, model violation and verification for OPC. Of course, there can be other variations, modifications, and alternatives.

Figure 6:
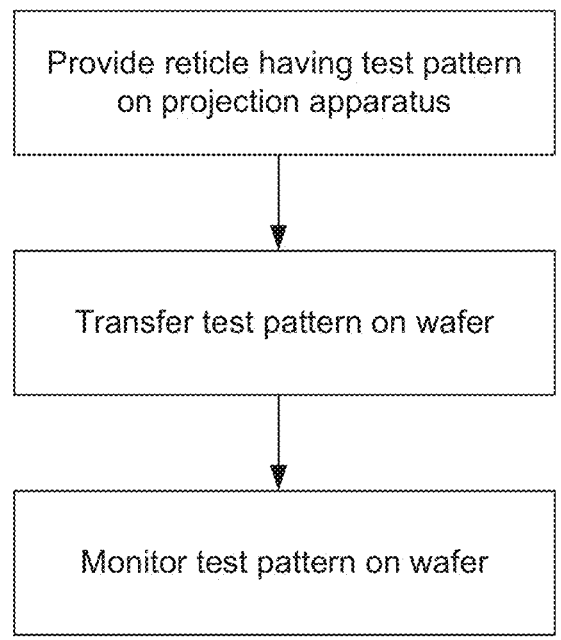
FIG. 6 illustrates a flowchart for a method of testing and monitoring a lithography process.

FIG. 6 illustrates a flowchart for a method of testing and monitoring a lithography process. In a specific embodiment, the method for performing a photolithography process for manufacturing of an integrated circuit may be summarized as follows:

(1) Providing a reticle on a projection apparatus, for example a stepper. The reticle has a test pattern defined thereon. The test pattern includes a plurality of one-dimensional structures and a plurality of two-dimensional structures in a specific embodiment.
(2) Transferring the test pattern defined on the reticle to at least one area on a wafer
(3) Focusing the projection apparatus on the test pattern transferred on the wafer during a photolithography process to perform a process monitoring.

The above sequence of steps provides a method of performing a lithography process for manufacturing an integrated circuit. Depending on the embodiment, one or more steps may be added, one or more steps may be skipped, one or more steps may be performed in a different sequence without departing from the scope of the present invention. In a preferred embodiment, the reticle can include a pattern for fabricating the integrated circuit. The method can further include transferring the pattern onto the wafer before or after the above focusing step is performed. Of course, there can be other variations, modifications, and alternatives.

Depending on the embodiment, the test pattern in the above method can include any or all the test patterns described above. In a specific embodiment, the test pattern has at least one two-dimensional structure that includes a dense region, an isolated region, and a linear region.

The method can be used in various manufacturing processes. For example, in a process in which a minimum geometry in the test pattern is 90 nm, the test pattern described above can be no more than 16×16 μm. In another process in which a minimum geometry in the test pattern is 45 nm, the test pattern described above can be no more than 8×8 μm. In still another process in which a minimum geometry in the test pattern is 30 nm, the test pattern can be no more than 4×4 μm.

In another embodiment, a method for performing a photolithography process includes providing a reticle on a projection apparatus. The reticle has a test pattern including a plurality of test structures. In an embodiment, the test pattern includes:

1. first and second dense regions, each of the dense regions having three or more test structures in a two-dimensional arrangement;
2. a linear region between the first and a second dense regions, the linear region having two or more test structures in a linear arrangement; and
3. one or more isolated regions, each having one or two test structures, each of the isolated region being spaced apart from the dense regions and the linear region.

An example of the above test pattern is shown in FIG. 4. In some embodiments, the above method also includes transferring the test pattern defined on the reticle to at least one area on a wafer, and focusing the projection apparatus on the test pattern transferred on the wafer during a photolithography process to perform process monitoring. In an embodiment, the test structures include contact hole test structures. In another embodiment, the method also includes identifying asymmetry in test pattern transferred to the wafer. In yet another embodiment, a minimum geometry in the test pattern is 90 um; and the test pattern has a length of no more than 10 um in either a first direction or a second direction.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:
1. A lithographic mask reticle, comprising:
a first mask region including a first mask pattern configured for use in fabricating electronic circuit structures; and
a second mask region including a second mask pattern configured for use in fabricating test structures, the second mask pattern comprising:
a first region having a plurality of first test structures arranged in in a two-dimensional array;
a second region having a plurality of second test structures arranged in in a two-dimensional array; and
a linear region disposed between the first and second region and having a plurality of third test structures arranged in a one-dimensional array.
2. The lithographic mask reticle of claim 1, wherein the second mask pattern further comprises one or more isolated regions spaced apart from the first and second regions, and the linear region, the one or more isolated regions having one or more test structures.

3. The lithographic mask reticle of claim 1, wherein the electronic circuit structures are characterized by a minimum geometry of 90 nm, and the second mask region is characterized by an area equal to or smaller than 16 um by 16 um.

4. The lithographic mask reticle of claim 1, wherein the electronic circuit structures are characterized by a minimum geometry of 45 nm, and the second mask region is characterized by an area equal to or smaller than 8 um by 8 um.

5. The lithographic mask reticle of claim 1, wherein the electronic circuit structures are characterized by a minimum geometry of 30 nm, and the second mask region is characterized by an area equal to or smaller than 4 um by 4 um.

6. The lithographic mask reticle of claim 1, wherein the lithographic mask reticle comprises a plurality of the first mask patterns and a plurality of the second mask patterns, wherein each of the second mask patterns is disposed between two adjacent first mask patterns.

7. The lithographic mask reticle of claim 1, wherein the lithographic mask reticle comprises a plurality of the first mask patterns and a plurality of the second mask patterns, wherein each of the second mask patterns is disposed diagonally between four adjacent first mask patterns.

8. The lithographic mask reticle of claim 1, wherein the second mask region includes at least 30 structures selected from the group consisting of Full dense line, Isolated line, Semi-dense line (forbidden pitch), Semi-dense trench (forbidden pitch), Isolated trench, Bigmag structure, Isolated Head-to-head, T-shape dense, Nested iso H-H, Dense H-H, Symmetric dense T-shape, Iso T-shape, Iso trench H-H, Symmetric comb, Dense comb, Semi-dense comb, Semi-trench comb, Iso line-end shortening, 45° D/R, Iso pipe, Dense pipe, 135° corner, 45° corner, 45° trench, 90° iso corner, 90° iso trench, 90° dense corner, Iso Hole, Iso island, Sandglass shape, Iso intrusion, Concave, Double scattering Bar, Single scattering Bar, Perpendicular iso H-H, Perpendicular dense H-H, 2-to-1 trench, D&C Swerve, T to big block, Solid circle, Hollow circle, T to big 45° block, Trench Funnel, Gradient Line, and Gradient trench.

9. A reticle comprising:
a plurality of mask regions; and
a test pattern disposed adjacent to four mask regions, the test pattern comprising:
 a first region having a plurality of first test structures arranged in in a two-dimensional array;
 a second region having a plurality of second test structures arranged in in a two-dimensional array; and
 a linear region disposed between the first and second region and having a plurality of third test structures arranged in a one-dimensional array.

10. The reticle of claim 9, wherein each of the mask regions comprises a plurality of electronic circuit structures, and the test pattern comprises one of each of the electronic circuit structures.

11. The reticle of claim 10, wherein the test pattern is no more than 16×16 microns if a minimum geometry of the structures is 90 nm.

12. The reticle of claim 10, wherein the test pattern is no more than 8×8 microns if a minimum geometry of the structures is 45 nm.

13. The reticle of claim 10, wherein the test pattern is no more than 6×6 microns if a minimum geometry of the structures is 30 nm.

14. The reticle of claim 9, wherein the test pattern further comprises:
an isolated region spaced apart from the first and second dense regions and the linear region.

15. A reticle comprising:
a plurality of mask regions, each one of the mask regions having a first pattern including a plurality of different electronic circuit structures; and
a test pattern disposed between two mask regions, the test pattern comprising:
 a first region having a plurality of first test structures arranged in in a two-dimensional array;
 a second region having a plurality of second test structures arranged in in a two-dimensional array; and
 a linear region disposed between the first and second region and having a plurality of third test structures arranged in a one-dimensional array.

16. The reticle of claim 15, wherein the test pattern comprises one of each of the different electronic circuit structures.

17. The reticle of claim 16, wherein the test pattern is no more than 16×16 microns if a minimum geometry of the structures is 90 nm.

18. The reticle of claim 16, wherein the test pattern is no more than 8×8 microns if a minimum geometry of the structures is 45 nm.

19. The reticle of claim 16, wherein the test pattern is no more than 6×6 microns if a minimum geometry of the structures is 30 nm.

20. The reticle of claim 15, wherein the first test structures comprise contact hole patterns.

* * * * *